United States Patent
Aoki et al.

(10) Patent No.: US 10,021,814 B2
(45) Date of Patent: Jul. 10, 2018

(54) COOLING APPARATUS FOR COMPUTER MEMORY

(71) Applicant: Intel Corporation, Santa Clara, CA (US)

(72) Inventors: Russell S. Aoki, Tacoma, WA (US); Alan W. Tate, Puyallup, WA (US); Ralph W. Jensen, Steilacoom, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/254,535

(22) Filed: Sep. 1, 2016

(65) Prior Publication Data
US 2018/0063998 A1    Mar. 1, 2018

(51) Int. Cl.
*H05K 7/20* (2006.01)
*G06F 1/20* (2006.01)

(52) U.S. Cl.
CPC ......... *H05K 7/20763* (2013.01); *G06F 1/203* (2013.01); *H05K 7/2039* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,978,472 B2* | 7/2011 | Campbell | .......... | H05K 7/20781 165/104.33 |
| 8,004,841 B2* | 8/2011 | Cipolla | .............. | F28D 15/0233 165/104.33 |
| 8,027,162 B2* | 9/2011 | Campbell | ............ | H05K 7/2079 165/104.33 |
| 8,081,473 B2* | 12/2011 | Cipolla | .............. | H01L 23/4093 165/104.33 |
| 8,599,557 B2* | 12/2013 | Peterson | ................... | G06F 1/20 165/104.21 |
| 8,638,559 B2* | 1/2014 | Barina | ................ | H01L 23/4093 165/104.21 |

* cited by examiner

*Primary Examiner* — Lisa Lea Edmonds
(74) *Attorney, Agent, or Firm* — Schwabe, Williamson & Wyatt, P.C.

(57) ABSTRACT

Embodiments herein relate to liquid cooling interfaces for computer memory components. An apparatus for cooling a computer memory component may include a support and a cooling tube coupled with the support, where the cooling tube is to be positioned parallel to a computer memory connector to receive the computer memory component, and the cooling tube is to be removably coupled with a memory component heat spreader associated with the computer memory component. In some embodiments, the support may be a liquid manifold. Other embodiments may be described and/or claimed.

24 Claims, 7 Drawing Sheets

COOLING APPARATUS FOR COMPUTER MEMORY

FIELD

Embodiments of the present disclosure generally relate to the field of computer component cooling and, more particularly, to a cooling apparatus for computer memory.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

The High Performance Compute (HPC) industry is moving toward thinner and more tightly packaged products for energy efficiency and compute power. These high density, thin server products may not have sufficient airflow to support adequate air cooled solutions for some components. Typically, memory modules and other replaceable electronic components in computers rely on air cooled solutions and/or dedicated self-contained water cooled solutions. With more tightly packaged products, air cooling may not be adequate and self-contained water cooled solutions may not allow for easy field replacement of the component being cooled.

BRIEF DESCRIPTION OF THE DRAWINGS

Embodiments of the liquid cooling interfaces for computer memory components of the present disclosure may overcome these limitations. The embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Embodiments of the present disclosure describe liquid cooling interfaces for computer memory components. In various embodiments, an apparatus for cooling a computer memory component may include a support and a cooling tube coupled with the support, where the cooling tube is to be positioned parallel to a computer memory connector to receive the computer memory component, and the cooling tube is to be removably coupled with a memory component heat spreader associated with the computer memory component. In some embodiments, the cooling tube may be positioned above and alongside the computer memory connector.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

Figure 1:
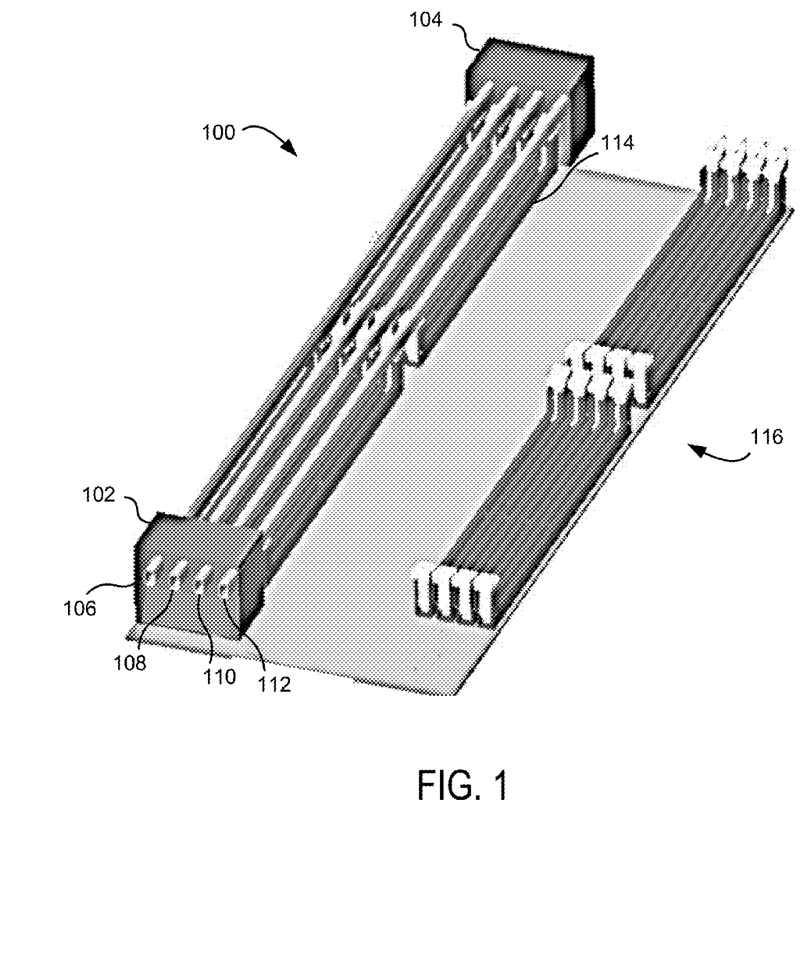
FIG. 1 illustrates an apparatus for cooling a computer memory component, according to various embodiments.

FIG. 1 illustrates an apparatus 100 for cooling a computer memory component, according to various embodiments. In some embodiments, the apparatus 100 may include a first support 102 and a second support 104. In various embodiments, the first support 102 and/or the second support 104 may be a liquid manifold or a cooling block. In some embodiments, a plurality of cooling tubes, shown as a first cooling tube 106, a second cooling tube 108, a third cooling tube 110, and a fourth cooling tube 112, may be positioned above and alongside one or more computer memory connectors 114. In some embodiments, the first cooling tube 106, the second cooling tube 108, the third cooling tube 110, and the fourth cooling tube 112 may be positioned parallel to one or more computer memory connectors 114. In various embodiments, the first support 102 may be used for holding one or more of the cooling tubes 106, 108, 110, and 112 at an end of one or more of the computer memory connectors 114. In some embodiments, the second support 104 may be used for holding one or more of the cooling tubes 106, 108, 110, and 112 at another end of one or more of the computer memory connectors 112. In various embodiments, the first support 102 may hold a first end of one or more of the cooling tubes 106, 108, 110, and 112 at a first end of a computer memory connector and the second support 104 may hold a second end of the one or more cooling tubes at a second end of the same computer memory connector. In some embodiments where the cooling tubes 106, 108, 110, and 112 may be positioned to run along the length of more than one computer memory connector such as shown in FIG. 1, the first support 102 may hold a first end of one or more of the cooling tubes 106, 108, 110, and 112 at an end of one or more of a first plurality of computer memory connectors and the second support 104 may hold a second end of the one or more cooling tubes at an end of one or more of a second plurality of computer memory connectors.

In some embodiments, one or more of the cooling tubes 106, 108, 110, and 112 may be removably coupled with one or more memory component heat spreaders associated with one or more computer memory components when the computer memory component is coupled with one of the computer memory connectors 114. In various embodiments, the cooling tubes 106, 108, 110, and 112 may contribute in cooling the memory component by removing thermal energy from the memory component heat spreader associated with the computer memory component. In various embodiments, the cooling tubes 106, 108, 110, and 112 may be formed of a metal such as copper, a copper alloy, aluminum, stainless steel, graphene, or some other thermally conductive material. In some embodiments, one or more of the cooling tubes 106, 108, 110, and 112 may be used for routing a cooling liquid above and alongside one or more computer memory connectors 114, and/or above and between two or more computer memory connectors 114. In various embodiments, one or more of the cooling tubes 106, 108, 110, and 112 may be used for routing the cooling liquid parallel to one or more computer memory connectors 114 and/or parallel to and between two or more memory connectors 114.

In various embodiments, the cooling tubes 106, 108, 110, and 112 may be positioned above and alongside a plurality of computer memory connectors arranged in a rectangular array of four computer memory connectors across and two memory connectors in length. A similar rectangular array of computer memory connectors 116 is shown for comparison without the apparatus 100. In various embodiments, the computer memory connectors 114 may be slots to receive memory modules such as dual in-line memory modules (DIMMs). In some embodiments, the computer memory connectors 114 may be positioned with a standard DIMM spacing. In various embodiments, the DIMM spacing may be approximately 0.37 inches. Although all four of the cooling tubes are shown as passing through the first support 102, in other embodiments, the first support 102 may be a liquid manifold having a single liquid port fluidly coupled with a first end of the cooling tubes 106, 108, 110, and 112 to provide a single coupling point with a system fluid network. In various embodiments, the second support 104 may be a liquid manifold coupled with a second end of the cooling tubes 106, 108, 110, and 112. In some embodiments, the first support 102 and the second support 104 may be cooling blocks and the cooling tubes 106, 108, 110, and 112 may be heat pipes.

Figure 2:
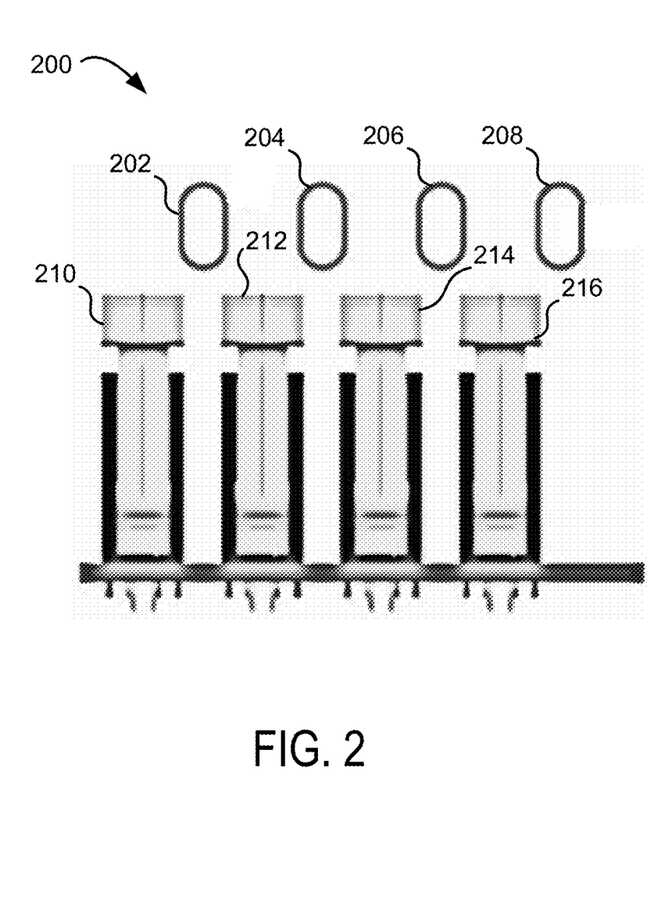
FIG. 2 illustrates a cross-sectional view of a portion of an apparatus for cooling a computer memory component, according to various embodiments.

FIG. 2 illustrates a cross-sectional view of a portion of an apparatus 200 for cooling a computer memory component, according to various embodiments. In some embodiments, the apparatus 200 may be structured in a similar manner to that described with respect to the apparatus 100. In various embodiments, the apparatus 200 may include a first cooling tube 202, a second cooling tube 204, a third cooling tube 206, and a fourth cooling tube 208. In some embodiments, the first cooling tube 202 may be positioned above and alongside a first memory connector 210 and a second memory connector 212. The second cooling tube 204 may be positioned above and between the first memory connector 210 and the second memory connector 212 in various embodiments. In some embodiments, the third cooling tube 206 may be positioned above and between the second memory connector 212 and between the second memory connector 212 and a third memory connector 214. The fourth cooling tube 208 may be positioned above and alongside a fourth memory connector 216 in various embodiments. A support (e.g., first support 102 or second support 104), holding structure, manifold, and/or bracket may be used for supporting and/or holding the cooling tubes 202, 204, 206, and 208 in various embodiments but is not shown for clarity. In various embodiments, one or more of the cooling tubes 202, 204, 206, and 208 may be positioned parallel to one or more of the computer memory connectors 210, 212, 214, or 216.

In some embodiments, one or more of the cooling tubes 202, 204, 206, and 208 may be removably coupled with one or more memory component heat spreaders associated with one or more computer memory components when the computer memory component is coupled with one of the computer memory connectors 210, 212, 214, or 216. In some embodiments, one or more of the cooling tubes 202, 204, 206, and 208 may be used for routing a cooling liquid above and alongside one or more computer memory connectors 210, 212, 214, or 216, and/or above and between two or more computer memory connectors 210, 212, 214, and 216. In various embodiments, one or more of the cooling tubes 202, 204, 206, and 208 may be used for routing the cooling liquid parallel to one or more computer memory connectors 210, 212, 214, or 216 and/or parallel to and between two or more memory connectors 210, 212, 214, and 216.

Figure 3:
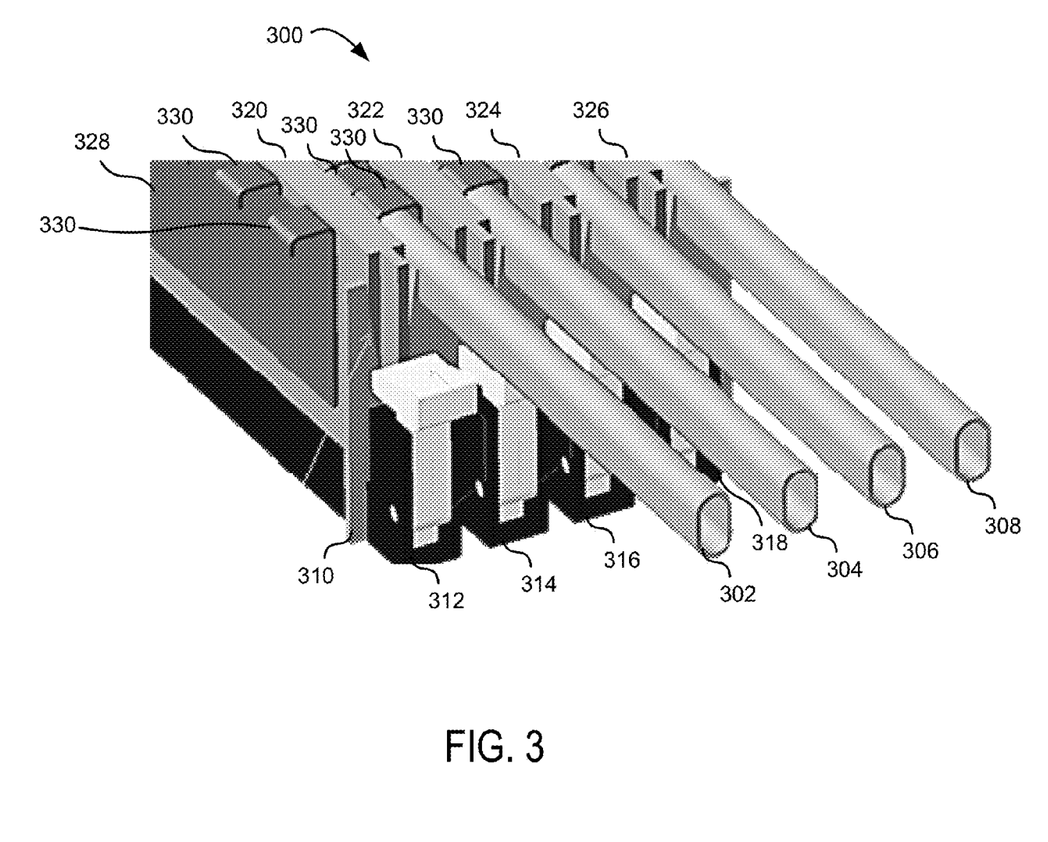
FIG. 3 illustrates a partial schematic view of a portion of an apparatus for cooling a computer memory component, coupled with a memory module assembly, according to various embodiments.

FIG. 3 illustrates a partial schematic view of a portion of an apparatus 300 for cooling a computer memory component, coupled with a plurality of memory module assemblies, according to various embodiments. In some embodiments, the apparatus 300 may be structured in similar fashion to that described with respect to the apparatus 100 and/or the apparatus 200 of FIGS. 1 and 2. In various embodiments, the apparatus 300 may include a first cooling tube 302, a second cooling tube 304, a third cooling tube 306, and a fourth cooling tube 308. In some embodiments, the apparatus 300 may also include a bracket 310 that may be coupled with one or more of the cooling tubes 302, 304, 306, and/or 308. In various embodiments, the bracket 310 may also serve as a card guide to assist in guiding memory modules into their connectors during installation and/or replacement. The bracket 310 may be used for holding and/or supporting the cooling tubes 302, 304, 306, and 308 in various embodiments. The cooling tubes 302, 304, 306, and 308 may be positioned above and alongside a first memory connector 312, a second memory connector 314, a third memory connector 316, and a fourth memory connector 318 in similar fashion to that described with respect to the cooling tubes and memory connectors of the apparatus 100 and/or the apparatus 200. In various embodiments, one or more of the cooling tubes 302, 304, 306, and 308 may be positioned parallel to one or more of the computer memory connectors 312, 314, 316, or 318. A first memory module assembly 320, a second memory module assembly 322, a third memory module assembly 324, and a fourth memory module assembly 326 are shown inserted into memory connectors 312, 314, 316, and 318, respectively. In some embodiments, the apparatus 300 may also include a support (e.g., first support 102 or second support 104), manifold, or cooling block for holding and/or serving to route fluid into or out of the cooling tubes 302, 304, 306, and 308 that is not shown in FIG. 3 for clarity.

In various embodiments, the memory module assemblies may each include a DIMM thermally coupled with a heat spreader 328 having cooling tube contact protrusions 330 that extend in an alternating fashion from each side of the DIMM. In some embodiments, one or more of the cooling tubes 302, 304, 306, and 308 may be removably coupled with the cooling tube contact protrusions 330 extending from one or more heat spreaders 328 of the first memory module assembly 320, the second memory module assembly 322, the third memory module assembly 324, and the fourth memory module assembly 326. In some embodiments, one or more of the cooling tubes 302, 304, 306, and 308 may be used for routing a cooling liquid above and alongside one or more of the computer memory connectors 312, 314, 316, and 318, and/or above and between two or more computer memory connectors 312, 314, 316, and 318. In various embodiments, one or more of the cooling tubes 302, 304, 306, and 308 may be used for routing the cooling liquid parallel to one or more computer memory connectors 312, 314, 316, or 318 and/or parallel to and between two or more memory connectors 312, 314, 316, and 318.

Figure 4:
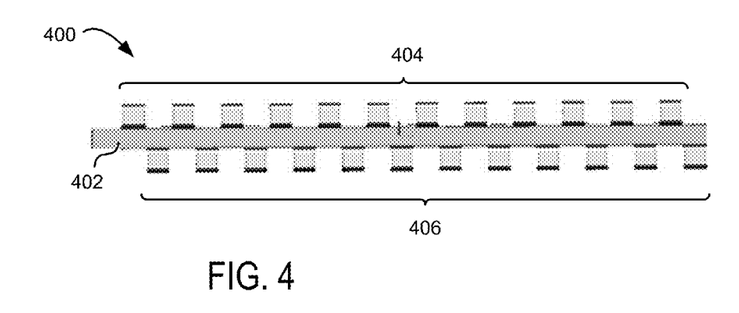
FIG. 4 illustrates a top view of a memory module assembly, according to various embodiments.

FIG. 4 illustrates a top view of a memory module assembly 400, according to various embodiments. In some embodiments, the memory module assembly 400 may include a DIMM 402 and a heat spreader having a first plurality of cooling tube contact protrusions 404 and a second plurality of cooling tube contact protrusions 406 that may extend in an alternating fashion from each side of the DIMM 402 as shown. In various embodiments, the first plurality of cooling tube contact protrusions 404 may removably couple with a first cooling tube (e.g., cooling tube 106, 202, or 302) and the second plurality of cooling tube contact protrusions 406 may removably couple with a second cooling tube (e.g., cooling tube 108, 204, or 304) when the DIMM 402 is coupled with a computer memory connector (e.g., one of the computer memory connectors 114 below and between the cooling tube 106 and the cooling tube 108, computer memory connector 212, or computer memory connector 314).

Figure 5:
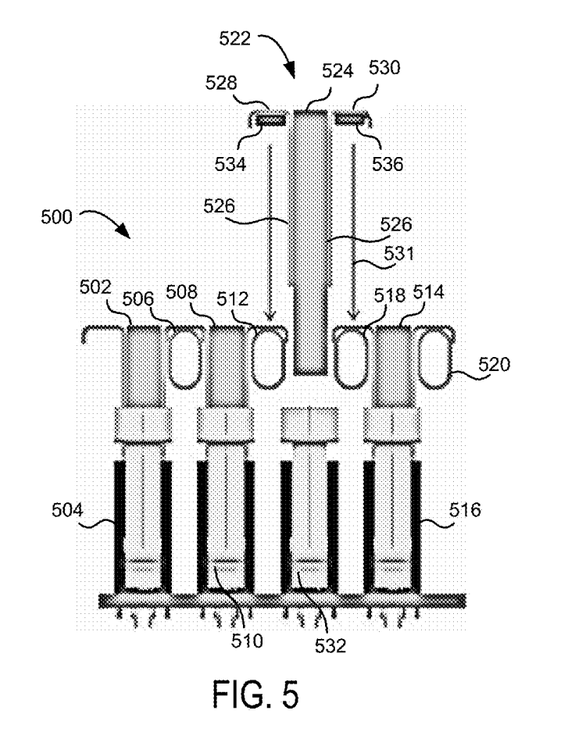
FIG. 5 illustrates an end view of a portion of an apparatus for cooling a computer memory component coupled with a plurality of memory module assemblies, according to various embodiments.

FIG. 5 illustrates an end view of a portion of an apparatus 500 for cooling a computer memory component coupled with a plurality of memory module assemblies, according to various embodiments. An insertion direction of another memory module assembly is also shown, according to some embodiments. In various embodiments, the apparatus 500 may be structured in similar fashion to the apparatus 100, the apparatus 200, and/or the apparatus 300 described with respect to FIGS. 1-3. In various embodiments, the apparatus 500 may include a plurality of cooling tubes positioned above and alongside and/or parallel to a plurality of computer memory connectors as described with respect to the apparatus 200 of FIG. 2.

In various embodiments, the apparatus 500 may include a first memory module assembly 502 coupled with a first computer memory connector 504 and a first cooling tube 506. A second memory module assembly 508 may be coupled with a second computer memory connector 510 located below and between the first cooling tube 506 and a second cooling tube 512 in some embodiments. In various embodiments, a third memory module assembly 514 may be coupled with a third computer memory connector 516 located below and between a third cooling tube 518 and a fourth cooling tube 520. In some embodiments, a fourth memory module assembly 522 having a computer memory module 524 and a heat spreader apparatus 526 with a first protrusion 528 on a first side and a second protrusion 530 on a second side may be inserted in a direction 531 into a fourth computer memory connector 532. A support (e.g., first support 102 or second support 104), holding structure, manifold, and/or bracket (e.g., bracket 310) may be used for supporting and/or holding the cooling tubes 506, 512, 518, and 520 in various embodiments but is not shown for clarity.

In various embodiments, the protrusions of the of the memory module assemblies may thermally couple with the cooling tubes when the computer memory modules are coupled with the computer memory connectors. In some embodiments, one or more of the cooling tubes 506, 512, 518, and 520 may be removably coupled with the cooling tube contact protrusions extending from one or more heat spreaders of the first memory module assembly 502, the second memory module assembly 508, the third memory module assembly 514, and the fourth memory module assembly 522 when the memory module assembly 502, 508, 514, or 522 is coupled with one of the computer memory connectors 504, 510, 516, or 532. In some embodiments, one or more of the cooling tubes 506, 512, 518, and 520 may be used for routing a cooling liquid above and alongside one or more of the computer memory connectors 504, 510, 516, or 532, and/or above and between two or more of the computer memory connectors 504, 510, 516, and 532. In various embodiments, one or more of the cooling tubes 506, 512, 518, and 520 may be used for routing the cooling liquid parallel to one or more computer memory connectors 504, 510, 516, or 532 and/or parallel to and between two or more memory connectors 504, 510, 516, and 532.

In some embodiments, the memory module assemblies may include a thermal interface material (TIM) on an underside of the protrusions. In various embodiments, a first TIM 534 may be on an underside of the first protrusion 528 and a second TIM 536 may be on an underside of the second protrusion 530. In some embodiments, the first protrusion 528 may be positioned and/or structured such that the first TIM 534 is compressed between the first protrusion 528 and the second cooling tube 512 when the computer memory module 524 is coupled with the fourth computer memory connector 532. In various embodiments, the second protrusion 5530 may be positioned and/or structured such that the second TIM 536 is compressed between the second protrusion 530 and the third cooling tube 518 when the computer memory module 524 is coupled with the fourth computer memory connector 532. In some embodiments, the TIM may be a thermal gap pad, thermal grease, or any other type of TIM.

Figure 6:
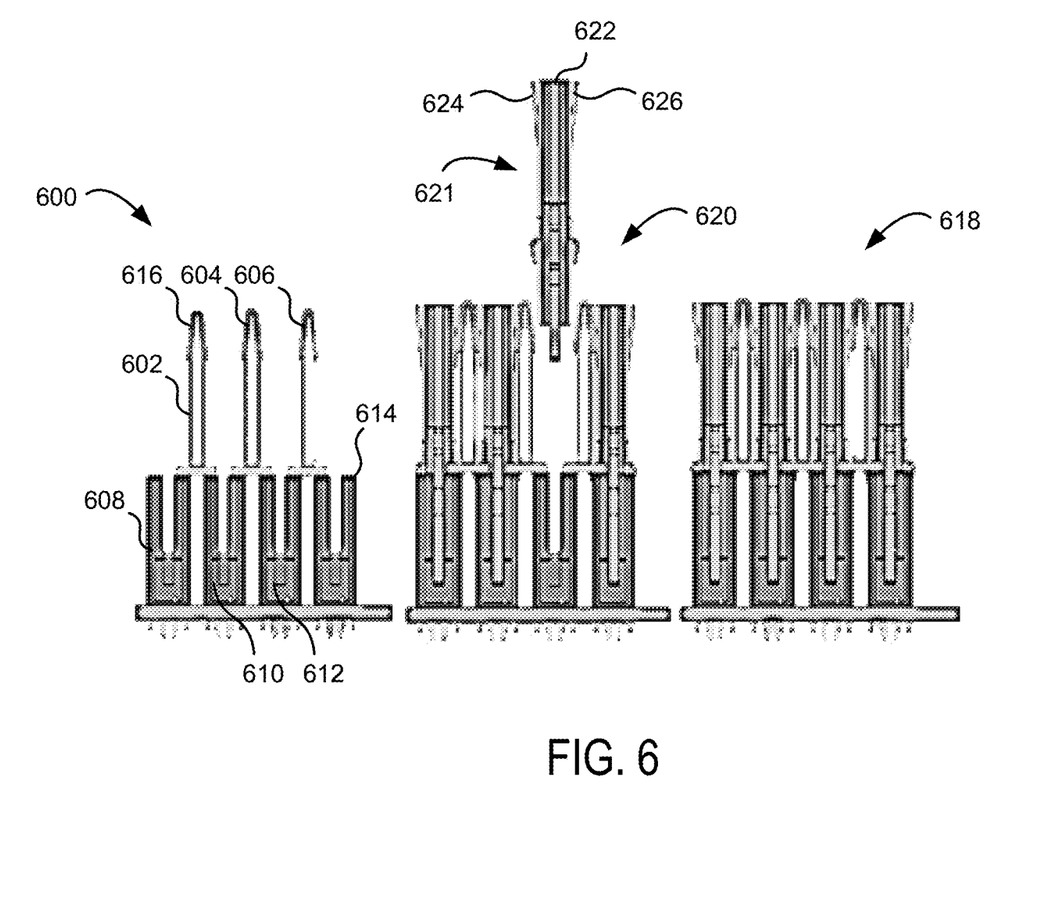
FIG. 6 illustrates a cross-sectional view of a portion of an apparatus for cooling a computer memory component, according to other embodiments.

FIG. 6 illustrates a cross-sectional view of a portion of an apparatus 600 for cooling a computer memory component, according to other embodiments. In some embodiments, the apparatus 600 may be structured in similar fashion to the apparatus 100, the apparatus 200, the apparatus 300, and/or the apparatus 500, but may have cooling tubes with a different cross-sectional profile than those of the other embodiments. In various embodiments, the apparatus 600 may include a first cooling tube 602, a second cooling tube 604, and a third cooling tube 606 positioned above, alongside, and/or between a first computer memory connector 608, a second computer memory connector 610, a third computer memory connector 612, and a fourth computer memory connector 614. In various embodiments, one or more of the cooling tubes 602, 604, and 606 may be positioned parallel to one or more of the computer memory connectors 608, 610, 612, or 614. In some embodiments, the cooling tubes may include a thermal interface material 616 disposed on a top portion of the cooling tube. An apparatus 618 with a plurality of computer memory assemblies installed is shown. An apparatus 620 with a plurality of computer memory assemblies installed and an uninstalled computer memory assembly 621 having a computer memory module 622 and a heat spreader with a first tab 624 on a first side of the computer memory module 622 and a second tab 626 on a second side of the computer memory module 622 is also shown. A support (e.g., first support 102 or second support 104), holding structure, manifold, and/or bracket (e.g., bracket 310) may be used for supporting and/or holding the cooling tubes 602, 604, and 606 in various embodiments but is not shown for clarity.

In various embodiments, the tabs on the heat spreaders of the computer memory assemblies may be structured such that they are to be thermally coupled with the cooling tubes when the computer memory modules are inserted in the computer memory connectors. In some embodiments, one or more of the cooling tubes 602, 604, and 606 may be removably coupled with the cooling tube contact protrusions extending from one or more heat spreaders of one or more memory module assemblies when the memory module assembly is coupled with one of the computer memory connectors 608, 610, 612, or 614. In some embodiments, one or more of the cooling tubes 602, 604, and 606 may be used for routing a cooling liquid above and alongside one or more of the computer memory connectors 608, 610, 612, or 614, and/or above and between two or more of the computer memory connectors 608, 610, 612, and 614. In various embodiments, one or more of the cooling tubes 602, 604, and 606 may be used for routing the cooling liquid parallel to one or more computer memory connectors 608, 610, 612, or 614 and/or parallel to and between two or more memory connectors 608, 610, 612, and 614.

Figure 7:
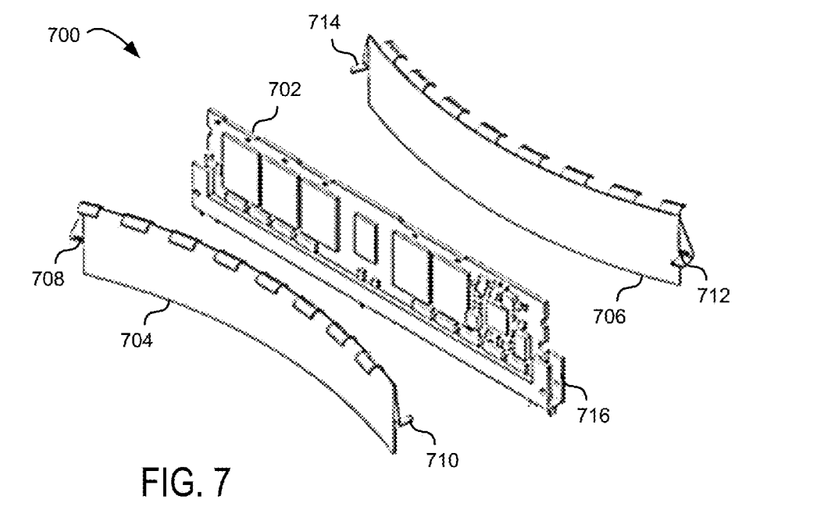
FIG. 7 illustrates a computer memory heat spreader apparatus with a computer memory component, according to various embodiments.

FIG. 7 illustrates a computer memory heat spreader apparatus 700 for coupling with a computer memory component 702, according to various embodiments. In various embodiments, the computer memory component 702 may be a DIMM. In some embodiments, the heat spreader apparatus 700 may include a first thermally conductive strip 704 having a first surface to contact a first side of the computer memory component 702. In various embodiments, the heat spreader apparatus may include a second thermally conductive strip 706 having a second surface to contact a second side of the computer memory component 702. In some embodiments, the first thermally conductive strip 704 may include a first plurality of cooling tube contact protrusions extending from a top edge of the first thermally conductive strip 704. In various embodiments, the second thermally conductive strip 706 may include a second plurality of cooling tube contact protrusions extending from a top edge of the second thermally conductive strip 706.

In some embodiments, the first thermally conductive strip 704 may include a first interlocking component 708 at a first end and a second interlocking component 710 at a second end. In various embodiments, the second thermally conductive strip 706 may include a third interlocking component 712 at a first end and a fourth interlocking component 714 at a second end. In some embodiments, the first interlocking component 708 and the fourth interlocking component 714 may be structured to couple together and the second interlocking component 710 and the third interlocking component 712 may be structured to couple together when the first and second thermally conductive strips 704, 706 are coupled with each other and the computer memory component 702. A portion of a computer memory connector 716 is shown coupled with the computer memory component 702. In some embodiments, the first and second thermally conductive strips 704, 706 may be coupled together with the computer memory component 702 in another manner such as by using one or more clips or screws when the heat spreader apparatus 700 is coupled with the computer memory component 702 to form a memory module assembly.

In various embodiments, the first thermally conductive strip 704 and the second thermally conductive strip 706 may be formed of a semi-flexible material and may have a curved shape with a convex surface facing the computer memory component 702 when not coupled with the computer memory component 702, such that a compressive force is exerted between the first thermally conductive strip 704 and the computer memory component 702 and between the second thermally conductive strip 706 and the computer memory component 702 when the first thermally conductive strip 704 is coupled with the second thermally conductive strip 706 and the computer memory component 702. In some embodiments, the first thermally conductive strip 704 and/or the second thermally conductive strip 706 may be formed of a metal such as copper, a copper alloy, aluminum, or some other metal. In some embodiments, the first thermally conductive strip 704 may have the same form as the second thermally conductive strip 706.

Figure 8:
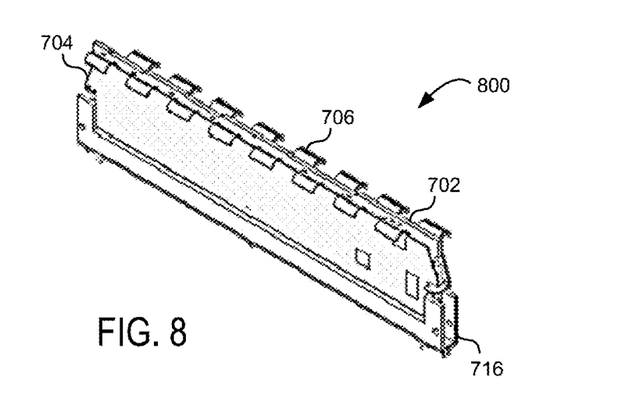
FIG. 8 illustrates the computer memory heat spreader apparatus of FIG. 7 assembled with the computer memory component in a memory module assembly, according to various embodiments.

FIG. 8 illustrates the computer memory heat spreader apparatus 700 of FIG. 7 assembled with the computer memory component 702 in a memory module assembly 800, according to various embodiments. The cooling tube contact protrusions of the first thermally conductive strip 704 and the second thermally conductive strip 706 may extend from the memory module assembly 800 in an alternating pattern in some embodiments. In various embodiments, the memory module assembly 800 may be structured to couple with the computer memory connectors and cooling tubes of the apparatus 100 of FIG. 1, the computer memory connectors and cooling tubes of the apparatus 200 of FIG. 2, the computer memory connectors and the cooling tubes of the apparatus 300 of FIG. 3, and/or the computer memory connectors and the cooling tubes of the apparatus 500 of FIG. 5. In some embodiments, the first plurality of cooling tube contact protrusions and the second plurality of cooling tube contact protrusions may be positioned such that they are deflected by a cooling tube when the computer memory component 702 is inserted into a computer memory connector, but maintain a compressive force against the cooling tube. In various embodiments, the memory module assembly 400 of FIG. 4 may represent a top view of the memory module assembly 800.

Figure 9:
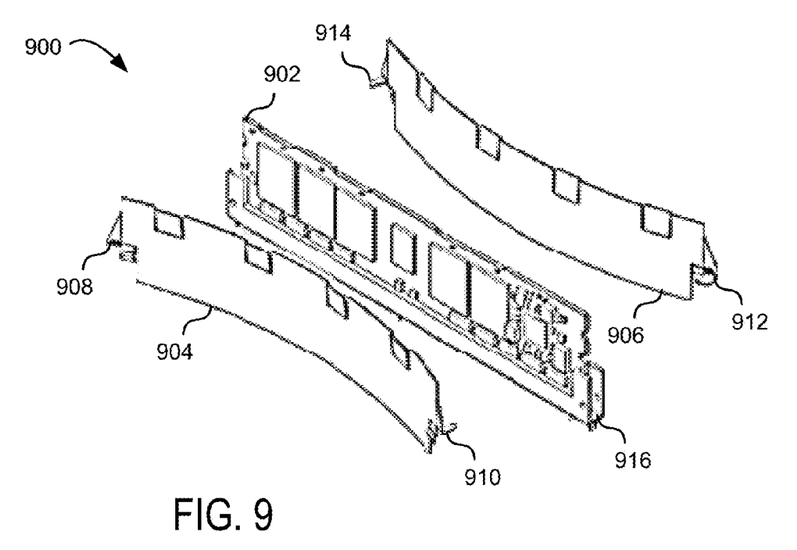
FIG. 9 illustrates another computer memory heat spreader apparatus with a computer memory component, according to various embodiments.

FIG. 9 illustrates a computer memory heat spreader apparatus 900 for coupling with a computer memory component 902, according to various embodiments. In some embodiments, the heat spreader apparatus 900 may be configured in a similar fashion to the heat spreader apparatus 700 of FIG. 7, but may have a cooling tube contact protrusions that extend in a different manner from the heat spreader apparatus 900 than those of the heat spreader apparatus 700.

In various embodiments, the computer memory component 902 may be a DIMM. In some embodiments, the heat spreader apparatus 900 may include a first thermally conductive strip 904 having a first surface to contact a first side of the computer memory component 902. In various embodiments, the heat spreader apparatus may include a second thermally conductive strip 906 having a second surface to contact a second side of the computer memory component 902. In some embodiments, the first thermally conductive strip 904 may include a first plurality of cooling tube contact protrusions extending from a top portion of the first thermally conductive strip 904. In various embodiments, the second thermally conductive strip 906 may include a second plurality of cooling tube contact protrusions extending from a top portion of the second thermally conductive strip 906.

In some embodiments, the first thermally conductive strip 904 may include a first interlocking component 908 at a first end and a second interlocking component 910 at a second end. In various embodiments, the second thermally conductive strip 906 may include a third interlocking component 912 at a first end and a fourth interlocking component 914 at a second end. In some embodiments, the first interlocking component 908 and the fourth interlocking component 914 may be structured to couple together and the second interlocking component 910 and the third interlocking component 912 may be structured to couple together when the first and second thermally conductive strips 904, 906 are coupled with each other and the computer memory component 902. In some embodiments, the first thermally conductive strip 904 and/or the second thermally conductive strip 906 may be formed of a metal such as copper, a copper alloy, aluminum, or some other metal. A portion of a computer memory connector 916 is shown coupled with the computer memory component 902. In some embodiments, the first thermally conductive strip 904 may have the same form as the second thermally conductive strip 906.

Figure 10:
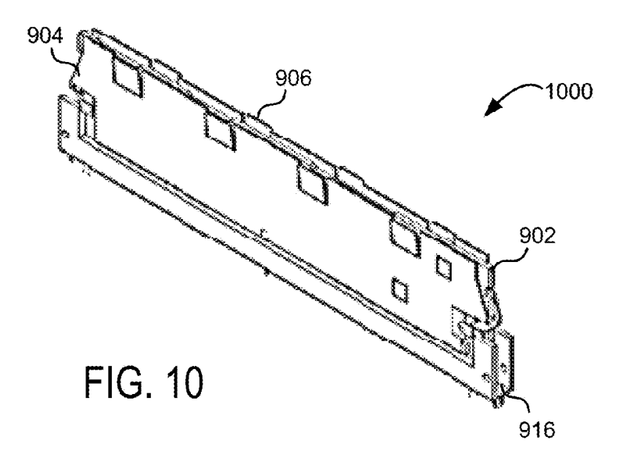
FIG. 10 illustrates the computer memory heat spreader apparatus of FIG. 9 assembled with the computer memory component in a memory module assembly, according to various embodiments.

FIG. 10 illustrates the computer memory heat spreader apparatus of FIG. 9 assembled with the computer memory component 902 in a memory module assembly 1000, according to various embodiments. The cooling tube contact protrusions of the first thermally conductive strip 904 and the second thermally conductive strip 906 may extend from the memory module assembly 1000 in an alternating pattern in some embodiments. In various embodiments, the memory module assembly 1000 may be structured to couple with the computer memory connectors and cooling tubes of the apparatus 600, the apparatus 618, and/or the apparatus 620 described with respect to FIG. 6. In some embodiments, the cooling tube contact protrusions of the first thermally conductive strip 904 and the second thermally conductive strip 906 may match an angle of the top portions of the cooling tubes of the apparatus 600.

In various implementations, the apparatus 100, the apparatus 200, the apparatus 300, the apparatus 500, the apparatus 600, the memory module assembly 400, the memory module assembly 800, and/or the memory module assembly 1000 may comprise one or more components of a server, a high performance computing device, a desktop computer, a data center, a laptop computer, or any other electronic device that processes data. In some embodiments, the apparatus 100, the apparatus 200, the apparatus 300, and/or the apparatus 500 may be structured to fit within a one rack unit (1 U) enclosure along with any memory module assemblies coupled with them.

EXAMPLES

Example 1 may include an apparatus for cooling a removable computer memory component comprising: a support; and a cooling tube coupled with the support, wherein the cooling tube is to be positioned parallel to a computer memory connector to receive the removable computer memory component, and the cooling tube is to be removably coupled with a memory component heat spreader associated with the removable computer memory component.

Example 2 may include the subject matter of Example 1, wherein the support is a liquid manifold.

Example 3 may include the subject matter of Example 2, wherein the liquid manifold is a first liquid manifold and the apparatus further comprises a second liquid manifold coupled with the cooling tube.

Example 4 may include the subject matter of Example 1, wherein the support is a cooling block and the cooling tube is a heat pipe.

Example 5 may include the subject matter of any one of Examples 1-4, wherein the cooling tube is a first cooling tube to be positioned above and alongside a first side of the computer memory connector to be removably coupled with a first side of the memory component heat spreader, and wherein the apparatus further comprises a second cooling tube to be positioned above and alongside a second side of the computer memory connector to be removably coupled with a second side of the memory component heat spreader.

Example 6 may include the subject matter of any one of Examples 1-5, further comprising a thermal interface material on a contact surface of the cooling tube.

Example 7 may include the subject matter of any one of Examples 1-6, wherein the cooling tube is formed of a metal.

Example 8 may include the subject matter of Example 7, wherein the cooling tube is formed of copper or a copper alloy.

Example 9 may include the subject matter of any one of Examples 1-4, wherein the cooling tube is a first cooling tube, the computer memory connector is a first computer memory connector, the removable computer memory component is a first removable computer memory component, and the apparatus further comprises a second cooling tube, wherein the first cooling tube is to be positioned above and between the first computer memory connector and a first side of a second computer memory connector to receive a second removable computer memory component, and the second cooling tube is to be positioned above and alongside a second side of the second computer memory connector.

Example 10 may include the subject matter of Example 9, wherein the first cooling tube is to run above and alongside a third computer memory connector.

Example 11 may include the subject matter of any one of Examples 1-10, further comprising a computer device having the removable computer memory component, wherein the memory component heat spreader is thermally coupled with the removable computer memory component.

Example 12 may include a computer memory heat spreader apparatus comprising: a first thermally conductive strip having a first surface to contact a first side of a computer memory module; a second thermally conductive strip having a second surface to contact a second side of the computer memory module; a first plurality of cooling tube contact protrusions extending from a top portion of the first thermally conductive strip; and a second plurality of cooling tube contact protrusions extending from a top portion of the second thermally conductive strip.

Example 13 may include the subject matter of Example 12, wherein the first plurality of cooling tube contact protrusions extend from a top edge of the first thermally conductive strip and the second plurality of cooling tube contact protrusions extend from a top edge of the second thermally conductive strip.

Example 14 may include the subject matter of any one of Examples 12-13, further comprising a thermal interface material on a lower surface of the first plurality of cooling tube contact protrusions and on a lower surface of the second plurality of cooling tube contact protrusions.

Example 15 may include the subject matter of any one of Examples 12-14, wherein the first plurality of cooling tube contact protrusions are positioned such that they are deflected by the cooling tube when a computer memory component coupled with the computer memory heat spreader apparatus is inserted into a computer memory connector but maintain a compressive force against the cooling tube.

Example 16 may include the subject matter of any one of Examples 12-15, wherein the first thermally conductive strip is formed of a semi-flexible material and has a curved shape with a convex surface facing the computer memory module when the first thermally conductive strip is not coupled with the second thermally conductive strip, such that a compressive force is exerted between the first thermally conductive strip and the memory module when the first thermally conductive strip is coupled with the second thermally conductive strip and the memory module.

Example 17 may include the subject matter of Example 16, wherein the second thermally conductive strip is formed of a semi-flexible material and has a curved shape with a convex surface facing the computer memory module when the second thermally conductive strip is not coupled with the first thermally conductive strip, such that a compressive force is exerted between the second thermally conductive strip and the memory module when the second thermally conductive strip is coupled with the first thermally conductive strip and the memory module.

Example 18 may include the subject matter of any one of Examples 12-17, wherein the first thermally conductive strip includes a first interlocking component at a first end and a second interlocking component at a second end, and wherein the second thermally conductive strip includes a third interlocking component at a first end and a second interlocking component at a second end, wherein the first and fourth interlocking components are structured to couple together and the second and third interlocking components are structured to couple together when the first and second thermally conductive strips are coupled with each other and the computer memory module.

Example 19 may include the subject matter of any one of Examples 12-18, wherein the first thermally conductive strip and the second thermally conductive strip have the same form.

Example 20 may include the subject matter of any one of Examples 12-19, wherein the first plurality of tube contact protrusions and the second plurality of tube contact protrusions extend from the computer memory heat spreader apparatus in an alternating pattern.

Example 21 may include an apparatus for computing comprising: a first and a second computer memory component; means for routing a cooling liquid parallel to and between a first computer memory connector and a second computer memory connector respectively receiving the first and second computer memory components, wherein the means for routing the cooling liquid is structured to removably couple with a first memory component heat spreader and a second memory component heat spreader respectively associated with the first and second computer memory components; and means for holding the means for routing the cooling liquid at a first end of the first computer memory connector.

Example 22 may include the subject matter of Example 21, wherein the first computer memory connector and the second computer memory connector are positioned with a standard dual in-line memory module (DIMM) spacing.

Example 23 may include the subject matter of any one of Examples 21-22, wherein the DIMM spacing is 0.37 inches.

Example 24 may include the subject matter of any one of Examples 21-23, further comprising means for providing a thermal interface between the means for routing the cooling liquid and the first and second memory component heat spreaders when the first and second memory component heat spreaders are coupled with the means for routing the cooling liquid, wherein the means for providing the thermal interface is coupled with the means for routing the cooling liquid.

Example 25 may include the subject matter of any one of Examples 21-24, further comprising a third computer memory component, and wherein the means for routing a cooling liquid is a first means for routing a cooling liquid, and the apparatus further comprises a second means for routing a cooling liquid above and between the second computer memory connector and a third computer memory connector receiving the third computer memory component.

Example 26 may include the subject matter of Example 11, wherein: the computer memory connector is a first computer memory connector; the removable computer memory component is a first removable computer memory component; the memory component heat spreader is a first memory component heat spreader; the computer device further includes a second removable computer memory component and a second memory component heat spreader thermally coupled with the second removable computer memory component; the apparatus further includes a second computer memory connector to receive the second removable computer memory component; the cooling tube is parallel to the second computer memory connector; the first memory component heat spreader includes a first plurality of protrusions; the second memory component heat spreader includes a second plurality of protrusions; and the cooling tube is to be removably coupled with individual protrusions from the first plurality of protrusions and individual protrusions from the second plurality of protrusions in an alternating fashion.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. An apparatus for cooling a removable computer memory component comprising:
    a support; and
    a cooling tube coupled with the support, wherein the cooling tube is to be positioned parallel to a computer memory connector to receive the removable computer memory component, and the cooling tube is to be positioned to be removably coupled with one or more cooling tube contact protrusions extending from a top portion of a memory component heat spreader associated with the removable computer memory component when the removable computer memory component is coupled with the computer memory connector, and is to remain coupled with the support when the removable computer memory component is removed from the computer memory connector, wherein the cooling tube is a first cooling tube to be positioned above and alongside a first side of the computer memory connector to be removably coupled with a first side of the memory component heat spreader, and wherein the apparatus further comprises a second cooling tube to be positioned above and alongside a second side of the computer memory connector to be removably coupled with a second side of the memory component heat spreader.

2. The apparatus of claim 1, wherein the support is a liquid manifold.

3. The apparatus of claim 2, wherein the liquid manifold is a first liquid manifold and the apparatus further comprises a second liquid manifold coupled with the cooling tube.

4. The apparatus of claim 2, wherein the first cooling tube is formed of a metal.

5. The apparatus of claim 1, wherein the support is a cooling block and the cooling tube is a heat pipe.

6. The apparatus of claim 1, further comprising a thermal interface material on a contact surface of the first cooling tube.

7. The apparatus of claim 1, wherein the computer memory connector is a first computer memory connector, the removable computer memory component is a first removable computer memory component, and the apparatus further comprises a third cooling tube, wherein the first cooling tube is to be positioned above and between the first computer memory connector and a first side of a second computer memory connector to receive a second removable computer memory component, and the third cooling tube is to be positioned above and alongside a second side of the second computer memory connector.

8. The apparatus of claim 7, wherein the first cooling tube is to run above and alongside a third computer memory connector.

9. The apparatus of claim 1, further comprising a computer device having the removable computer memory component, wherein the memory component heat spreader is thermally coupled with the removable computer memory component.

10. The apparatus of claim 9, wherein:
    the computer memory connector is a first computer memory connector;
    the removable computer memory component is a first removable computer memory component;
    the memory component heat spreader is a first memory component heat spreader;
    the computer device further includes a second removable computer memory component and a second memory component heat spreader thermally coupled with the second removable computer memory component;
    the apparatus further includes a second computer memory connector to receive the second removable computer memory component;
    the first cooling tube is parallel to the second computer memory connector;
    the first memory component heat spreader includes a first plurality of protrusions that include the one or more cooling tube contact protrusions extending from the top portion of the first memory component heat spreader;
    the second memory component heat spreader includes a second plurality of protrusions; and
    the first cooling tube is to be removably coupled with individual protrusions from the first plurality of protrusions and individual protrusions from the second plurality of protrusions in an alternating fashion.

11. A computer memory heat spreader apparatus comprising:
    a first thermally conductive strip having a first surface to contact a first side of a computer memory module;
    a second thermally conductive strip having a second surface to contact a second side of the computer memory module;
    a first plurality of cooling tube contact protrusions extending from a top portion of the first thermally conductive strip; and
    a second plurality of cooling tube contact protrusions extending from a top portion of the second thermally conductive strip.

12. The apparatus of claim 11, wherein the first plurality of cooling tube contact protrusions extend from a top edge of the first thermally conductive strip and the second plurality of cooling tube contact protrusions extend from a top edge of the second thermally conductive strip.

13. The apparatus of claim 11, further comprising a thermal interface material on a lower surface of the first plurality of cooling tube contact protrusions and on a lower surface of the second plurality of cooling tube contact protrusions.

14. The apparatus of claim 11, wherein the first plurality of cooling tube contact protrusions are positioned such that they are deflected by a cooling tube when a computer memory component coupled with the computer memory heat spreader apparatus is inserted into a computer memory connector but maintain a compressive force against the cooling tube.

15. The apparatus of claim 14, wherein the first thermally conductive strip includes a first interlocking component at a first end and a second interlocking component at a second end, and wherein the second thermally conductive strip includes a third interlocking component at a first end and a fourth interlocking component at a second end, wherein the first and fourth interlocking components are structured to couple together and the second and third interlocking components are structured to couple together when the first and second thermally conductive strips are coupled with each other and the computer memory module.

16. The apparatus of claim 14, wherein the first thermally conductive strip and the second thermally conductive strip have a same form.

17. The apparatus of claim 11, wherein the first thermally conductive strip is formed of a semi-flexible material and has a curved shape with a convex surface facing the computer memory module when the first thermally conductive strip is not coupled with the second thermally conductive strip, such that a compressive force is exerted between the first thermally conductive strip and the memory module when the first thermally conductive strip is coupled with the second thermally conductive strip and the memory module.

18. The apparatus of claim 17, wherein the second thermally conductive strip is formed of a semi-flexible material and has a curved shape with a convex surface facing the computer memory module when the second thermally conductive strip is not coupled with the first thermally conductive strip, such that a compressive force is exerted between the second thermally conductive strip and the memory module when the second thermally conductive strip is coupled with the first thermally conductive strip and the memory module.

19. The apparatus of claim 11, wherein the first plurality of cooling tube contact protrusions and the second plurality of cooling tube contact protrusions extend from the computer memory heat spreader apparatus in an alternating pattern.

20. An apparatus for computing comprising:
a first and a second computer memory component;
means for routing a cooling liquid parallel to and between a first computer memory connector and a second computer memory connector respectively receiving the first and second computer memory components, wherein the means for routing the cooling liquid is structured to removably couple with a first plurality of cooling tube contact protrusions extending from a top portion of a first memory component heat spreader and a second plurality of cooling tube contact protrusions extending from a top portion of a second memory component heat spreader respectively associated with the first and second computer memory components; and
means for holding the means for routing the cooling liquid at a first end of the first computer memory connector.

21. The apparatus of claim 20, wherein the first computer memory connector and the second computer memory connector are positioned with a standard dual in-line memory module (DIMM) spacing.

22. The apparatus of claim 21, wherein the DIMM spacing is 0.37 inches.

23. The apparatus of claim 20, further comprising means for providing a thermal interface between the means for routing the cooling liquid and the first and second memory component heat spreaders when the first and second memory component heat spreaders are coupled with the means for routing the cooling liquid, wherein the means for providing the thermal interface is coupled with the means for routing the cooling liquid.

24. The apparatus of claim 20, further comprising a third computer memory component, and wherein the means for routing a cooling liquid is a first means for routing a cooling liquid, and the apparatus further comprises a second means for routing a cooling liquid above and between the second computer memory connector and a third computer memory connector receiving the third computer memory component.

* * * * *